(12) United States Patent
Sheinman

(10) Patent No.: US 12,695,424 B2
(45) Date of Patent: Jul. 28, 2026

(54) LOCAL-OSCILLATOR FILTERING IN A MIXER

(71) Applicant: AyDeeKay LLC, Aliso Viejo, CA (US)

(72) Inventor: Benny Sheinman, Aliso Viejo, CA (US)

(73) Assignee: Ay Dee Kay LLC, Aliso Viejo, CA (US)

( * ) Notice: Subject to any disclaimer, the term of this patent is extended or adjusted under 35 U.S.C. 154(b) by 337 days.

(21) Appl. No.: 18/585,755

(22) Filed: Feb. 23, 2024

(65) Prior Publication Data

US 2024/0291436 A1     Aug. 29, 2024

Related U.S. Application Data

(60) Provisional application No. 63/448,885, filed on Feb. 28, 2023.

(51) Int. Cl.
*H03D 7/14* (2006.01)
*H04B 1/16* (2006.01)

(52) U.S. Cl.
CPC ......... *H03D 7/1475* (2013.01); *H03D 7/1483* (2013.01); *H03D 2200/0023* (2013.01)

(58) Field of Classification Search
CPC ... H04B 1/06; H04B 1/10; H04B 1/16; H04B 1/38; H04B 1/40; H03D 7/14; H03D 7/1425; H03D 7/1441; H03D 7/1458; H03D 7/1475; H03D 7/1483; H03D 2200/0023; H03D 2200/0047
See application file for complete search history.

(56) References Cited

U.S. PATENT DOCUMENTS

| | | | | |
|---|---|---|---|---|
| 7,668,527 | B2 * | 2/2010 | Vaisanen | H03D 7/1458 |
| | | | | 455/323 |
| 8,139,670 | B1 | 3/2012 | Son | |
| 8,731,504 | B2 * | 5/2014 | Ismail | H04B 1/30 |
| | | | | 455/234.1 |
| 9,407,379 | B2 * | 8/2016 | Lau | H03D 7/1458 |
| 9,793,856 | B1 * | 10/2017 | Esmael | H03D 7/1441 |
| 11,265,034 | B1 * | 3/2022 | Tan | H04B 1/1607 |
| 2013/0009847 | A1 | 1/2013 | Alexpoulos | |
| 2022/0086669 | A1 | 3/2022 | Yao et al. | |

OTHER PUBLICATIONS

PCT Patent Appl. Serial No. PCT/US24/,017074, International Search Report and Written Opinion, Jun. 14, 2024.

* cited by examiner

*Primary Examiner* — Quochien B Vuong
(74) *Attorney, Agent, or Firm* — Steven Stupp

(57) ABSTRACT

An integrated circuit that selectively filters out common-mode and differential signals is described. This integrated circuit may include an RF receiver with a mixer that converts signals between a band of frequencies in the RF and a second band of frequencies based at least in part on second signals, where the second band of frequencies is less than the band of frequencies. Moreover, the mixer may include input ports that receive the second signals and include a filter circuit, electrically coupled in parallel with the input ports, that filters out the common-mode signals above a threshold frequency and filters out the differential signals below the threshold frequency. For example, the filter circuit may include a half-wavelength transmission line. Note that the mixer may convert the differential signals to the common-mode signals below the threshold frequency and may convert the common-mode signals to the differential signals above the threshold frequency.

20 Claims, 15 Drawing Sheets

DOWN-CONVERSION MIXER

IF IN

IF OUT

λ/2

LO AMP

LO IN

1600

OUTOUT K TRANSMIT SIGNALS
1610

PROVIDE L RECEIVE SIGNALS
1612

LOCAL-OSCILLATOR FILTERING IN A MIXER

CROSS REFERENCE TO RELATED APPLICATIONS

This application claims priority under 35 U.S.C. 119(c) to U.S. Provisional Application Ser. No. 63/448,885, entitled "Local-Oscillator Filtering in a Mixer," by Benny Sheinman, filed on Feb. 28, 2023, the contents of which are herein incorporated by reference.

FIELD

The present disclosure relates to techniques for encoding multiple-input multiple-output (MIMO) radar signals using Doppler code multiplexing.

BACKGROUND

In order to provide improved safety and more-convenient transportation options, many automotive manufacturers are including additional sensors and/or features in their vehicles. For example, self-driving cars typically include a wide variety of sensors, such as acoustic and/or electromagnetic sensors that monitor the surrounding environment to detect other vehicles, people, animals, or obstacles. However, there remain challenges that degrade the performance of radar sensors in automotive applications.

Notably, in a radio-frequency (RF) receiver frontend, a noise figure (NF) and an input 1 dB compression point are typically the main performance parameters. While good values of both of these performance parameters are desired, in practice there are usually tradeoffs. Consequently, in general there are two approaches for designing the RF receiver frontend: low-noise amplifier (LNA) first; and mixer first. These two configurations are shown in FIGS. 1 and 2, which present block diagrams illustrating existing RF receiver frontends. Placing the LNA first results in a larger signal at the mixer, which usually improves the noise performance but can limit the linearity. Alternatively, placing the mixer first typically improves the linearity, but can degrade the noise performance.

In the mixer-first configuration, the contributors to the noise include the RF input stage, the switching pairs and the local-oscillator (LO) amplifier generated noise. In order to reduce the noise, a double-balanced mixer topology is usually used to cancel the LO signal at the output. However, when compared to a single balanced-mixer topology, the double-balanced mixer is typically larger, consumes more power and generates more switching-pair noise.

SUMMARY

Embodiments of an integrated circuit are described. This integrated circuit includes an RF receiver with a mixer that converts signals between a band of frequencies in the RF and a second band of frequencies based at least in part on second signals (which are sometimes referred to as 'local oscillator' signals), where the second band of frequencies is less than the band of frequencies. Moreover, the mixer includes input ports that receive the second signals and include a filter circuit, electrically coupled in parallel with the input ports, that filters out common-mode signals above a threshold frequency and filters out differential signals below the threshold frequency.

Note that the filter circuit may include a transmission line. For example, the transmission line may include a half-wavelength transmission line. In some embodiments, the transmission line may include a shielded microstrip transmission line.

Moreover, the mixer may be a down-conversion mixer that converts the signals from the band of frequencies to the second band of frequencies. Alternatively, the mixer may be an up-conversion mixer that converts the signals from the second band of frequencies to the band of frequencies.

Furthermore, the RF receiver may include an amplifier that provides the second signals to the mixer.

Additionally, the signals in the band of frequencies may be single-ended signals and the signals in the second band of frequencies may be differential signals.

In some embodiments, the mixer may convert the differential signals to the common-mode signals below the threshold frequency and may convert the common-mode signals to the differential signals above the threshold frequency.

Note that the second band of frequencies may be greater than DC.

Moreover, the mixer may include a balanced mixer.

Another embodiment provides an electronic device that includes the integrated circuit.

Another embodiment provides a method for mixing signals. This method includes at least some of the operations performed by the integrated circuit.

This Summary is provided for purposes of illustrating some exemplary embodiments, so as to provide a basic understanding of some aspects of the subject matter described herein. Accordingly, it will be appreciated that the above-described features are examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF DRAWINGS

Note that like reference numerals refer to corresponding parts throughout the drawings. Moreover, multiple instances of the same part are designated by a common prefix separated from an instance number by a dash.

DETAILED DESCRIPTION

An integrated circuit that selectively filters out common-mode and differential signals is described. This integrated circuit may include an RF receiver with a mixer (such as a down-conversion mixer or an up-conversion mixer) that converts signals between a band of frequencies in the RF and a second band of frequencies based at least in part on second signals, where the second band of frequencies is less than the band of frequencies. Moreover, the mixer may include input ports that receive the second signals and include a filter circuit, electrically coupled in parallel with the input ports, that filters out the common-mode signals above a threshold frequency and filters out the differential signals below the threshold frequency. For example, the filter circuit may include a transmission line, such as a half-wavelength transmission line. Note that the mixer may convert the differential signals to the common-mode signals below the threshold frequency and may convert the common-mode signals to the differential signals above the threshold frequency.

By selectively filtering the common-mode and the differential signals, these circuit techniques may improve the performance of the RF receiver. Notably, the RF receiver may have an improved noise figure while maintaining high linearity. In addition, an area and a power consumption of the RF receiver may be reduced. Consequently, the circuit techniques may enable the use of MIMO and may improve the performance of radar measurements performed using the integrated circuit.

In the discussion that follows, a vehicle may include: an automobile, a sports utility vehicle, a truck, a motorcycle, a train, an aircraft, a boat, or another type of transportation conveyance. However, in the discussion that follows, an automobile is used as an illustrative example of the vehicle.

Moreover, in the discussion that follows, a vehicle may use one or more types of sensors to perform measurements associated with objects in the surrounding environment. While a wide variety of types of sensors may be used, in the discussion that follows radar sensors are used as an illustrative example. The radar sensors may perform measurements using at least one of a variety of modes of operation (such as pulsed or continuous-wave), and may involve the use of one or more types of modulation (such as amplitude, frequency and/or phase modulation). In some embodiments, frequency-modulated continuous-wave (FMCW) radar is used. Furthermore, transmitted and received radar signals (e.g., having carrier frequencies in a radar band of frequencies, such as between 3 MHz and 100 GHz) may be generated and/or processed in the analog domain and/or the digital domain.

Figure 1:
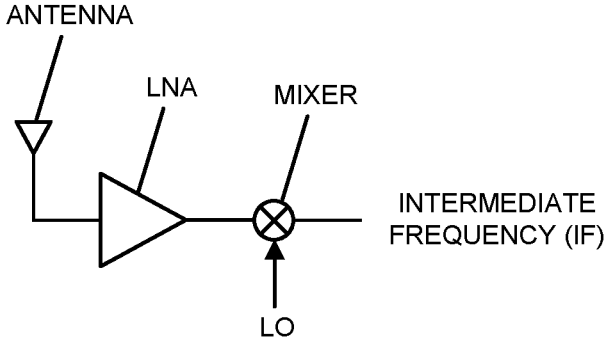
FIG. 1 is a block diagram illustrating an example of a low-noise amplifier (LNA)-first configuration in an existing radio-frequency (RF) receiver frontend.
Figure 2:
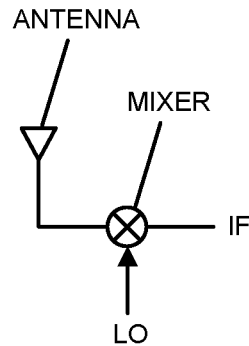
FIG. 2 is a block diagram illustrating an example of a mixer-first configuration in an existing RF receiver frontend.
Figure 3:
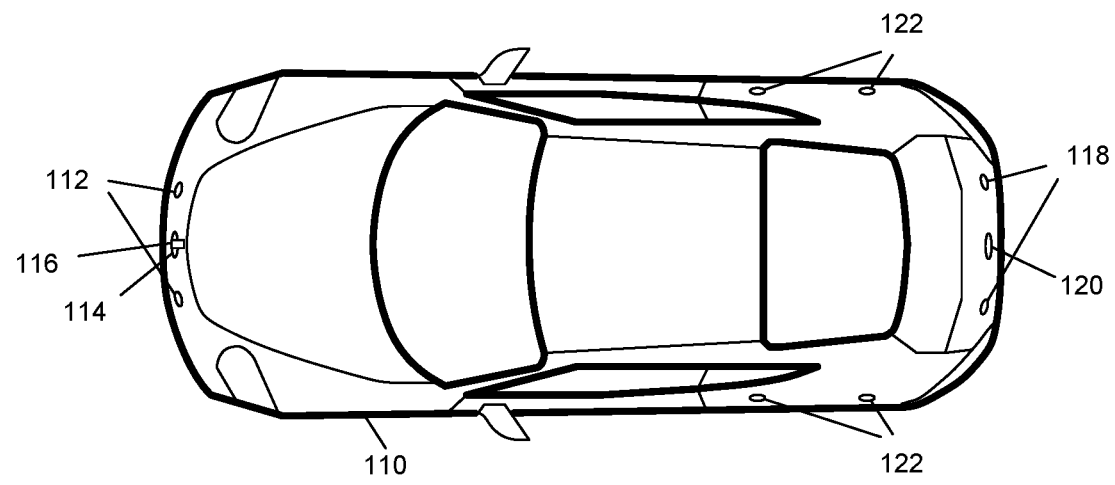
FIG. 3 is a drawing illustrating an example of a vehicle equipped with radar sensors according to some embodiments of the present disclosure.
Figure 4:
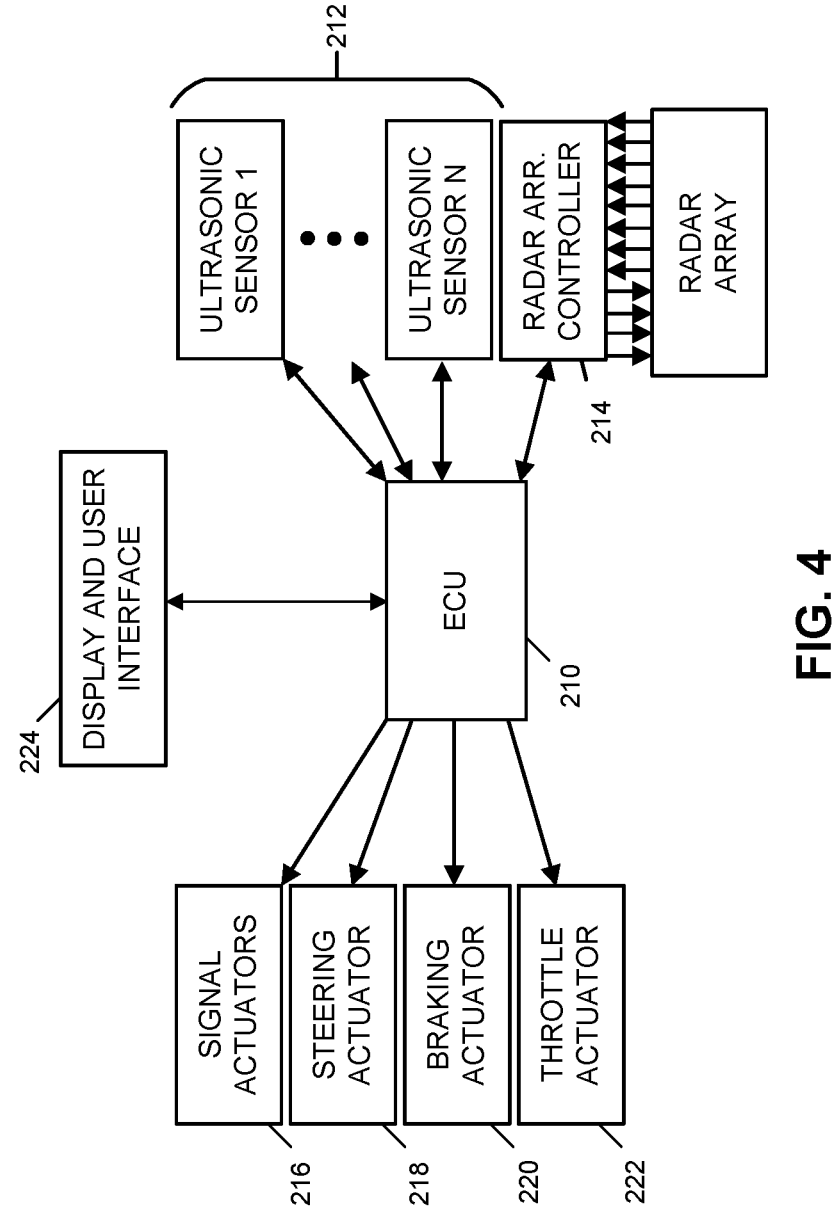
FIG. 4 is a block diagram illustrating an example of a driver-assistance system according to some embodiments of the present disclosure.

We now describe embodiments of the circuit techniques. FIG. 3 presents a drawing illustrating an example of a vehicle 110 equipped with an array of radar antennas, including: antennas 112 for short-range sensing (e.g., for parking assist), antennas 114 for mid-range sensing (e.g., for monitoring stop-and-go traffic and cut-in events), antennas 116 for long-range sensing (e.g., for adaptive cruise control and collision warning), each of which may be placed behind the front bumper cover. Antennas 118 for short-range sensing (e.g., for back-up assist) and antennas 120 for mid-range sensing (e.g., for rear-collision warning) may be placed behind the back-bumper cover. Moreover, antennas 122 for short-range sensing (e.g., for blind-spot monitoring and side-obstacle detection) may be placed behind the car fenders. Each antenna and each set of antennas may be grouped in one or more arrays. Furthermore, each array may be controlled by a radar-array controller 205 (FIG. 4). In some embodiments, a given set of antennas may perform multiple-input multiple-output (MIMO) radar sensing. The type, number, and configuration of sensors in the sensor arrangement for vehicles having driver-assist and self-driving features varies. The vehicle may employ the sensor arrangement for detecting and measuring distances/directions to objects in the various detection zones to enable the vehicle to navigate while avoiding other vehicles and obstacles. While the preceding discussion illustrates vehicle 110 with radar sensors, in other embodiments vehicle 110 may include additional types of sensors, such as LiDAR, an ultrasonic sensor, a camera, etc.

FIG. 4 presents a block diagram illustrating an example of a driver-assistance system. This driver assistance system may include an electronic control unit (ECU) 210 coupled to various sensors 212 and radar-array controller 214 as the center of a star topology. However, other topologies may include serial, parallel, and hierarchical (tree) topologies. Radar-array controller 214 may couple to the transmit and receive antennas (e.g., in antennas 114) to transmit electromagnetic waves, receive reflections, and determine a spatial relationship of the vehicle to its surroundings. Moreover, radar-array controller 214 may couple to carrier-signal generators. In some embodiments, radar-array controller 214 may control the timing and order of actuation of a plurality of carrier signal generators.

In order to provide automated parking assistance, ECU 210 may couple to a set of actuators, such as: a turn-signal actuator 216, a steering actuator 218, a braking actuator 220 and/or a throttle actuator 222. Moreover, ECU 210 may couple to an interactive user interface 224 to accept user input and to display various measurements and system status.

Using user interface 224, sensors, and actuators, ECU 210 may provide: automated parking, assisted parking, lane-change assistance, obstacle and blind-spot detection, autonomous driving and/or other desirable features. During operation of vehicle 110 (FIG. 3), sensor measurements may be acquired by ECU 210, and may be used by ECU 210 to determine a status of vehicle 110. Moreover, ECU 210 may act on the status and incoming information to actuate signaling and control transducers to adjust and maintain operation of vehicle 110. For example, the operations that may be provided by ECU 210 include driver-assist features, such as: automatic parking, lane following, automatic braking, self-driving, etc.

Furthermore, in order to obtain the measurements, ECU 210 may employ a MIMO radar system. Radar systems operate by emitting electromagnetic waves that travel outward from a transmit antenna before being reflected towards a receive antenna. The reflector may be any moderately reflective object in the path of the emitted electromagnetic waves. By measuring the travel time of the electromagnetic waves from the transmit antenna to the reflector and back to the receive antenna, the radar system may determine the distance to the reflector. Additionally, by measuring a Doppler shift of the electromagnetic waves, the radar system may determine a velocity of the reflector relative to vehicle 110 (FIG. 3). When multiple transmit or receive antennas are used, or when multiple measurements are made at different positions, the radar system may determine the direction to the reflector and, thus, may track the location of the reflector relative to vehicle 110 (FIG. 3). With more sophisticated processing, multiple reflectors may be tracked. In some embodiments, the radar system may employ array processing to 'scan' a directional beam of electromagnetic waves and to construct an image of the surroundings of environment around vehicle 110 (FIG. 3). In general, pulsed and/or continuous-wave implementations of the radar system may be implemented.

Figure 5:
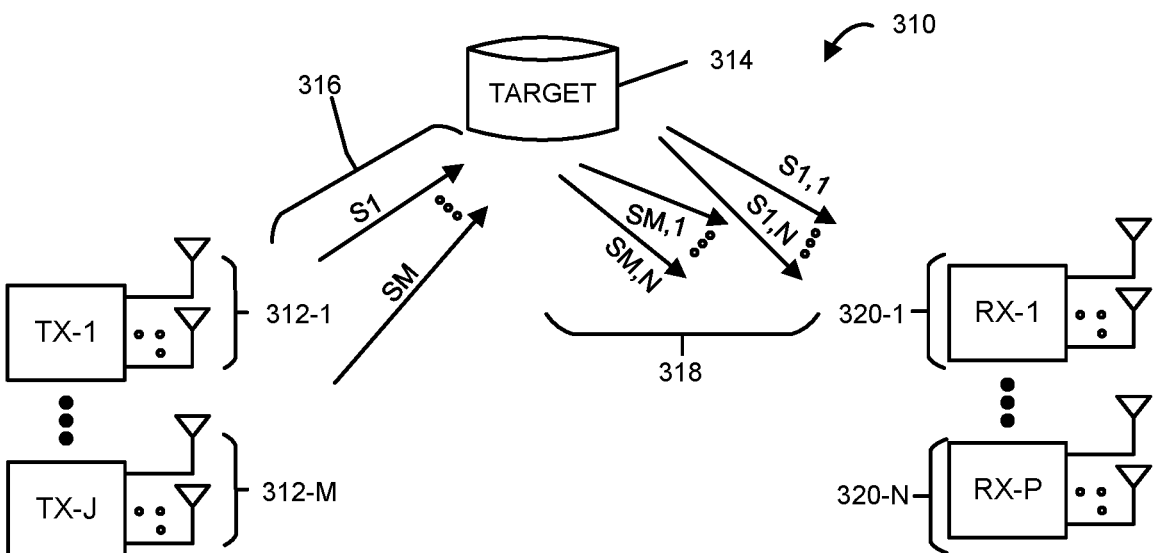
FIG. 5 is a block diagram illustrating an example of a radar system according to some embodiments of the present disclosure.

FIG. 5 presents a block diagram illustrating an example of a radar system 310 having a MIMO configuration, in which J transmitters are collectively coupled to M transmit antennas 312 to send transmit signals 316, where J and M are non-zero integers. The M possible transmit signals 316 may reflect from one or more reflectors or targets 314 to be received as receive signals 318 via N receive antennas 320 coupled to P receivers, where N and P are non-zero integers. Each receiver may extract the amplitude and phase or travel delay associated with each of the M transmit signals 316, thereby enabling the system to obtain $N \cdot M$ measurements (though only $J \cdot P$ of the measurements may be obtained concurrently). The processing requirements associated with each receiver extracting J measurements can be reduced via the use of time-division multiplexing and/or orthogonal coding. Moreover, the available antennas may be systematically multiplexed to the available transmitters and receivers to collect the full set of measurements for radar imaging.

Figure 6:
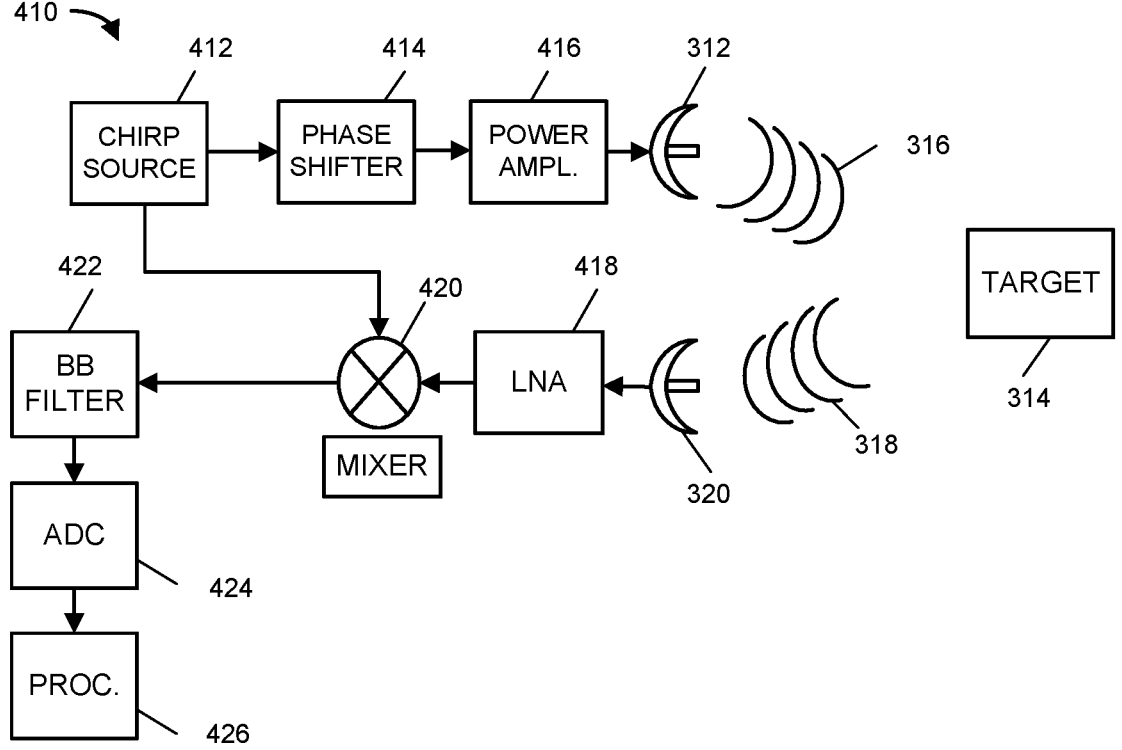
FIG. 6 is a block diagram illustrating an example of a radar system according to some embodiments of the present disclosure.

FIG. 6 presents a block diagram illustrating an example of a radar transceiver circuit 410 (e.g., in radar system 310 in FIG. 5). In some embodiments, radar transceiver circuit 410 is implemented as an integrated circuit in a packaged chip. Radar transceiver circuit 410 may include: a carrier-signal (chirp) generator 412, a phase shifter 414 (and, more generally, an encoder circuit, which may implement Doppler code multiplexing), an amplifier 416, and/or transmit antennas 312 which can transmit signals 316 based at least in part on the output of the carrier-signal generator 412. Moreover, radar transceiver circuit 410 may include: receiver antennas 320, a low-noise amplifier (LNA) 418, and/or a mixer 420 (which, in some embodiments, may implement Doppler code multiplexing). Mixer 420 may mix received signals 318 detected by receive antennas 312 with the signal from the carrier-signal generator 412. Furthermore, low-noise amplifier 418 may be used to amplify received signals 318 detected by receive antennas 320. In some embodiments, radar transceiver circuit 410 may include: a sensitivity time controller and equalizer (not shown), a broadband (BB) filter 422, an analog-to-digital converter (ADC) 424 and/or a processor 426 (e.g., ECU 210 and/or radar-array controller 214 in FIG. 4), which may perform further processing of the received signals (such as a Fourier transform). In some embodiments, processor 426 and low-noise amplifier 418 may be coupled for bi-directional communication.

Additionally, in some embodiments, carrier-signal generator 412 may be coupled to radar array-controller 214 (FIG. 4). Carrier-signal generator 412 may include a chirp generator to create an FMCW signal. The chip rate of carrier-signal generator 412 may be controlled by radar-array controller 214 (FIG. 4). In some embodiments, carrier-signal generator 412 may be deactivated by radar-array controller 214 (FIG. 4) to provide an unmodulated carrier signal. Moreover, carrier-signal generator 412 may be implemented as a local oscillation (LO) signal generator, a fractional-N phase lock loop (PLL) with a 24 controller, or as a direct-digital synthesis generator.

Furthermore, carrier-signal generator 412 may be coupled to transmit antennas 312 through phase shifter 414 and amplifier 416. Carrier-signal generator 412 may be coupled to receiving antennas 312 through mixer 420 and low-noise amplifier 418. Additionally, carrier-signal generator 412 may generate a transmit signal (e.g., a chirp signal). Amplifier 416 may receive the transmit signal from carrier-signal generator 412 and transmit signals 316 corresponding to the transmit signal from carrier-signal generator 412 may be transmitted using transmit antennas 312.

In some embodiments, a radar transmitter may include: a phase rotator, a bi-phase modulator, a variable gain amplifier, a switch, a power amplifier driver, a power amplifier, and/or a digital signal processor (DSP). Moreover, in some embodiments, a radar transmitter may include a digital controller. This digital controller may be included in the DSP or may be a separate component. Furthermore, the phase rotator may be used for digital phase modulation. Additionally, the radar transmitter may use a wave-modulated power amplifier in a digital-envelope modulation technique.

As discussed previously, noise often remains a problem in existing RF receiver frontends. In the disclosed circuit techniques, in order to reduce an LO amplifier-generated noise contribution to a mixer output, the LO signal is filtered at an input to a single balanced mixer. The resulting mixer may have reduced size, lower power consumption and less noise relative to existing mixer configurations.

Figure 7:
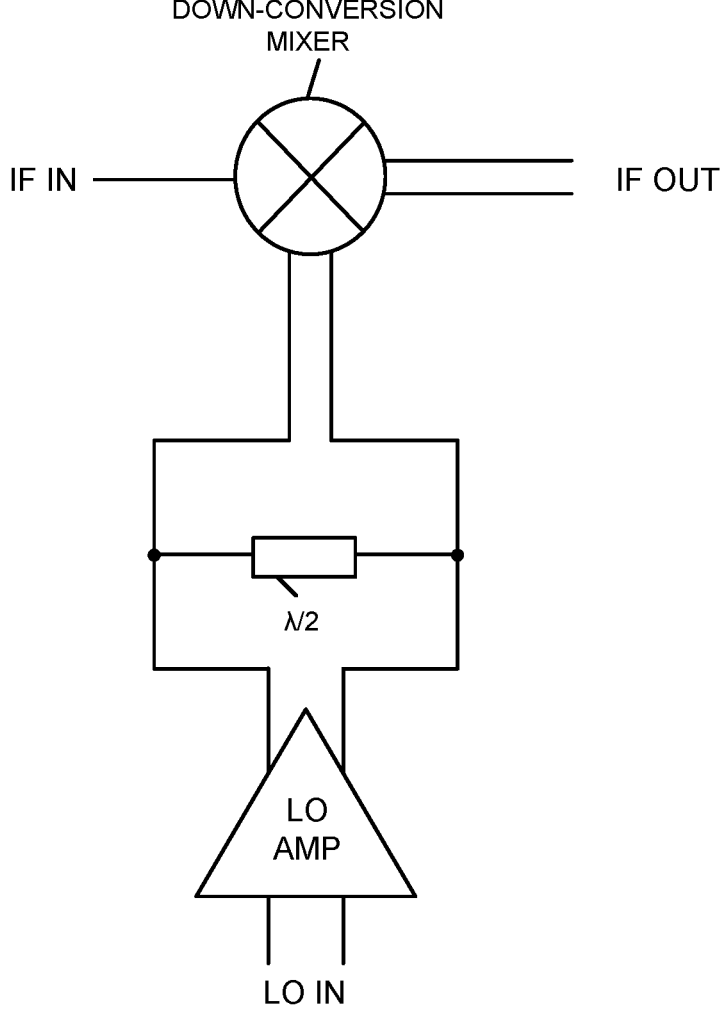
FIG. 7 is a block diagram illustrating an example of a down-conversion mixer according to some embodiments of the present disclosure.
Figure 8:
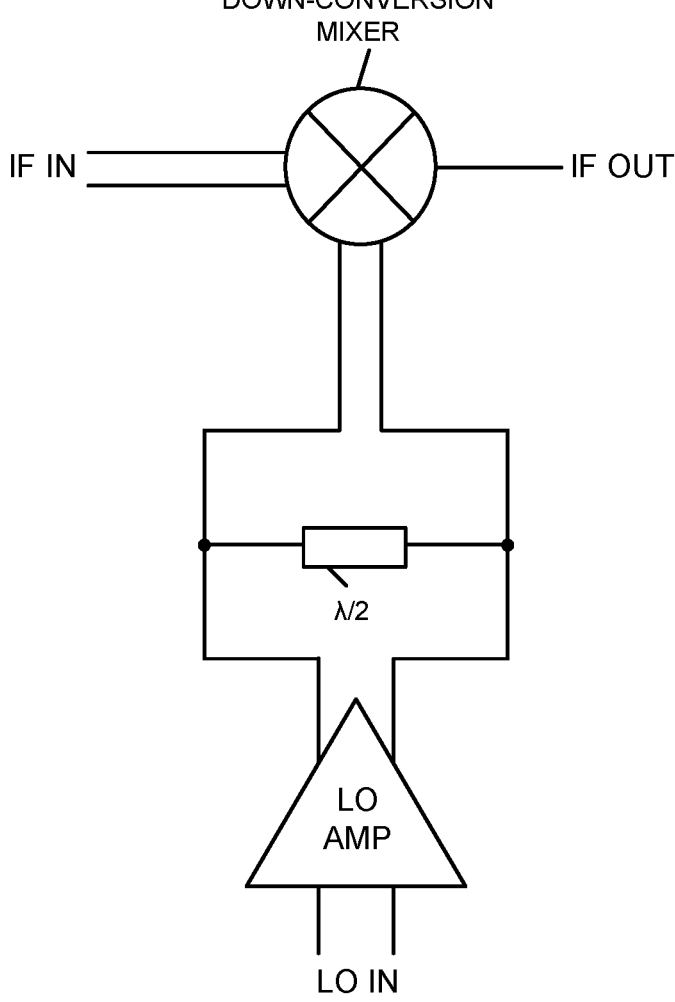
FIG. 8 is a block diagram illustrating an example of an up-conversion mixer according to some embodiments of the present disclosure.

The circuit techniques are illustrated in FIGS. 7 and 8, which present block diagrams illustrating example of a down-conversion mixer 700 and an up-conversion mixer 800. Notably, a filter circuit in down-conversion mixer 700 and in up-conversion mixer 800 may filter the intermediate-frequency (IF) and RF components of the LO amplifier noise. The IF component (which may include a low-frequency noise) may be shorted by an IF short, thereby transforming the IF noise to a common-mode signal that does not contribute noise to the differential IF output of the mixer. In the RF, the signal undergoes common-mode rejection to generate a differential signal. Because the LO signal is also differential, the generated noise associated with the mixing of the LO differential signal and the LO amplifier noise differential noise may result in a common-mode noise that again does not degrade the output noise of the mixer IF signal, which is differential. In some embodiments, the filter circuit may include a half-wavelength (2/2) transmission line that is connected in parallel to the mixer LO input and that introduces very low loss, while having a similar effect on the LO amplifier signal and noise at the IF and RF. Note that the half wavelength may correspond to a frequency of the LO differential signal.

Figure 9:
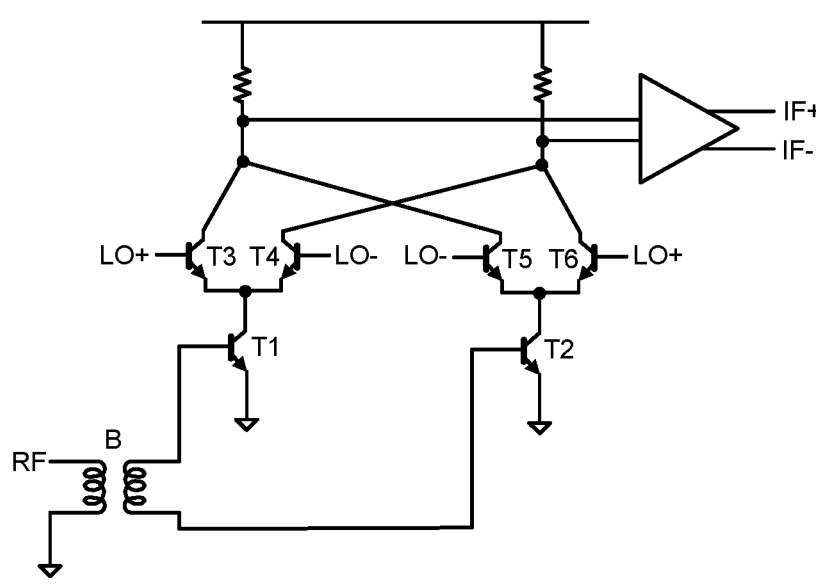
FIG. 9 is a block diagram illustrating a double-balanced mixer in an existing RF receiver frontend.

The disclosed circuit techniques are different from those used in many existing RF receiver frontends. For example, FIG. 9 presents a block diagram illustrating a double-balanced mixer in an existing RF receiver frontend 900. In existing RF receiver frontend 900, the LO amplifier RF and IF noise may be canceled out at the IF summation load (transistors T3-T5, T4-T6). However, using two LO switching pairs (T3, T4 and T5, T6) may increase the noise generated by the switching pair. Moreover, when the input signal is single ended, a differential signal may need to be generated (e.g., using balun B), which may introduce loss and degrade the noise figure. (Note that a balun may be a two-port component that is placed between a source and load when a differential, balanced circuit is connect to a single-ended, ground-referenced circuit.) Furthermore, the power consumption of the configuration shown in FIG. 9 (such as the LO power consumption) may be increased, and the area of existing RF receiver frontend 900 may be increased (such as the area of the LO amplifier, as well as the additional area of the balun).

Figure 10:
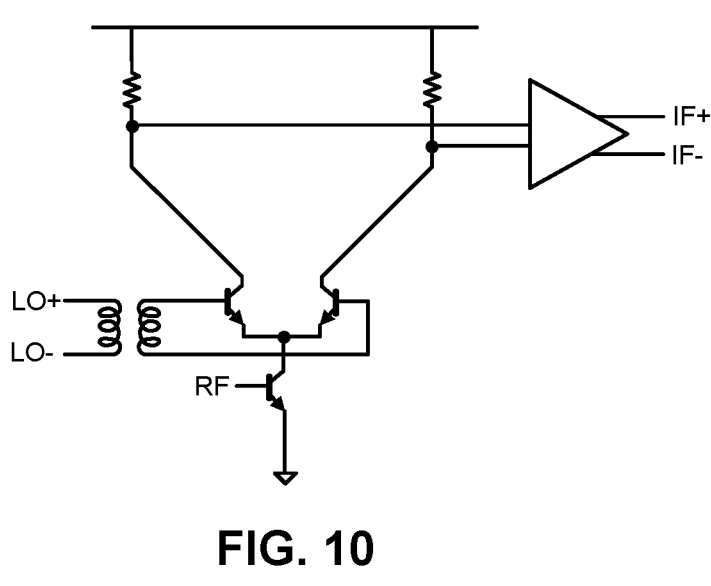
FIG. 10 is a block diagram illustrating an existing RF receiver frontend with a balun at a local-oscillator (LO) input.

Alternatively, FIG. 10 presents a block diagram illustrating an existing RF receiver frontend 1000 with a balun at an LO input. In existing RF receiver frontend 1000, the balun may reject the common mode. Notably, the common-mode LO RF noise from the LO amplifier may be rejected by the balun. Moreover, IF noise from the LO amplifier may be shorted by the balun. However, the balun may increase the area of existing RF receiver frontend 1000. Furthermore, the balun is placed in series and, therefore, may introduce significant loss, which may require a more powerful LO amplifier. Additionally, at high frequencies the balun may require a tailoring-matching circuit (which may include additional capacitors), which may further increase the area of existing RF receiver frontend 1000.

In the disclosed circuit techniques, a parallel common-mode filter or rejection circuit at the LO input to the mixer may be used to remove the noise generated by the LO amplifier. Notably, the rejection may be performed by a half-wavelength transmission line connected between the two differential LO signals driven from the LO amplifier. In some embodiments, the half-wavelength transmission line may be implemented by a lossy shielded microstrip transmission line at low metal layers with a trace that routes in a relatively small area. Because the half-wavelength transmission line is connected in parallel to the differential LO line at the input of the mixer (which may have relatively low input impedance compared with the differential impedance of the half-wavelength transmission line, which may be very high impedance), the insertion loss may be very small and may have little or no effect on the power driven by the LO amplifier to the mixer. This configuration may be used in additional circuits to reject common mode, e.g., replacing large transformer that may have electromagnetic leakage with transmission lines-based circuit and a half-wavelength transmission line to reject the common mode.

Figure 11:
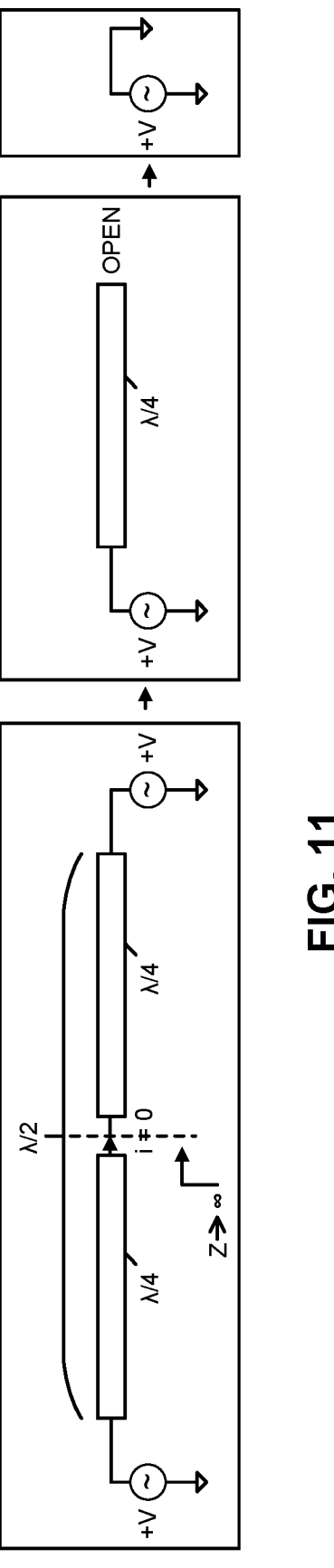
FIG. 11 is a block diagram illustrating an example of a half-wavelength transmission line according to some embodiments of the present disclosure.

We now describe the filter circuit, such as the half-wavelength transmission line. FIG. 11 presents a block diagram illustrating an example of a half-wavelength transmission line. For a common-mode signal, no or zero current may flow through the half-wavelength transmission line at the symmetry axis. Notably, a quarter-wavelength length of the transmission line may transform an open circuit to a short circuit that shorts the common-mode signal. Consequently, the common-mode signal may be suppressed by the short circuit (assuming a non-ideal short). At the IF (such as at low frequency), differential and common-mode noise may be shorted by the half-wavelength transmission line, which may act as a short circuit.

Figure 12:
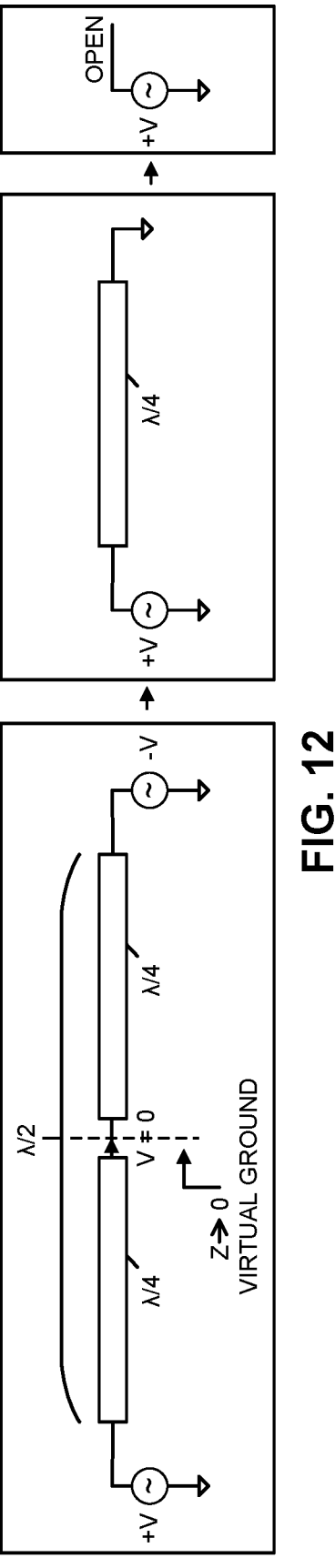
FIG. 12 is a block diagram illustrating an example of a half-wavelength transmission line according to some embodiments of the present disclosure.

FIG. 12 presents a block diagram illustrating an example of a half-wavelength transmission line. For a differential-mode signal, there may be a virtual ground at the symmetry axis of the half-wavelength transmission line. Notably, a quarter-wavelength length of the transmission line may transform a short circuit to an open circuit. The differential-mode signal may not be affected by the half-wavelength transmission line with very small insertion loss (which may be caused by non-ideal behavior). At the IF (such as at low frequency), the differential and common-mode noise may be shorted by the half-wavelength transmission line, which may act as a short circuit.

Figure 13:
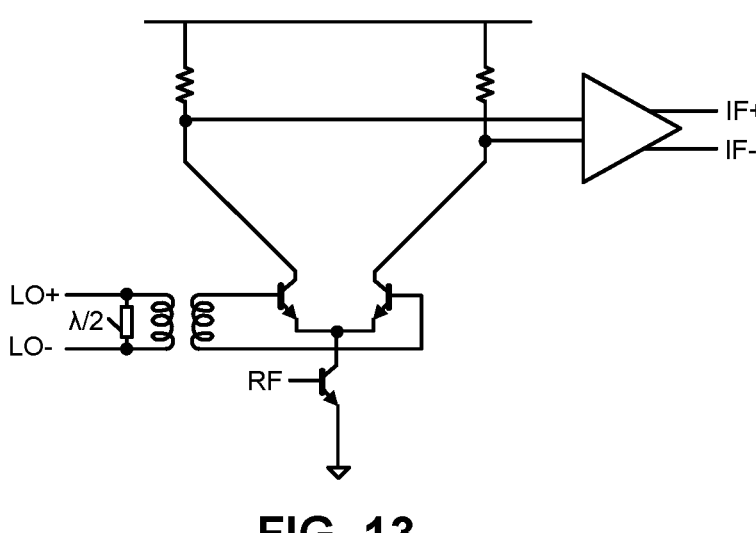
FIG. 13 is a block diagram illustrating an example of an RF receiver frontend according to some embodiments of the present disclosure.

FIG. 13 presents a block diagram illustrating an example of an RF receiver frontend. In FIG. 13, the LO-generated IF noise contributions may include small-signal signals, including: an RF signal ($rf_s$), the RF noise from the input stage ($rf_n$), the LO-amplifier noise at RF differential ($LO_{ampn\_rf\_diff}$), the LO-amplifier noise at RF common mode ($LO_{ampn\_rf\_cm}$), the LO-amplifier noise at IF differential ($LO_{ampn\_if\_diff}$), the LO-amplifier noise at IF common mode ($LO_{ampn\_if\_cm}$), the LO switching pair noise at RF ($LO_{swpairn\_rf}$), and the LO switching pair noise at IF ($LO_{swpairn\_if}$). Moreover, the large signals may include the LO signal ($LO_s$), which may be desired if it is the output signal. With these definition, the noise contribution may include $$rf_n \cdot LO_s + LO_{ampn\_if\_diff} + LO_{swpairn\_if} \cdot LO_{ampn\_rf\_diff} \cdot LO_s +$$

$$LO_{ampn\_rf\_cm} \cdot LO_s + LO_{swpairn\_rf} \cdot LO_s.$$

The first ($rf_n \cdot LO_s$), third ($LO_{swpairn\_if}$) and last ($LO_{swpairn\_if} \cdot LO_s$) terms in the noise contribution may be part of the mixer design. Moreover, the second term ($LO_{ampn\_if\_diff}$) in the noise contribution may be removed by the filter circuit acting as a low-frequency short. The fourth term ($LOampn\_rd\_diff \cdot LO_s$) in the noise contribution may be moved to IF common mode by the LO differential and may not affect the noise figure (because multiplying a differential signal by a differential signal may result in a common-mode signal). Furthermore, the fifth term ($LO_{swpairn\_if} \cdot LO_s$) in the noise contribution may be removed by filter circuit suppressing the common mode (note that $LO_{ampn\_if\_cm}$ does not contribute the noise at the differential IF output). Thus, the LO filtering (e.g., the half-wavelength transmission line) may be used to move RF added noise to common mode and to filter out the LO amplifier noise, thereby improving noise-figure performance.

In some embodiments, the LO signal may be a differential signal, the output from the mixer may be a differential signal and the noise input may be a common-mode signal. The product of the common-mode signal and a differential signal may be a differential signal, while the product of two differential signals may be a common-mode signal. Consequently, differential noise may be rejected. The half-wavelength transmission line may behave as an open circuit for a differential signal (because there is a virtual ground in the middle of the half-wavelength transmission line), so it may have no impact. However, for a common-mode signal, there may be no or zero current in the middle of the half-wavelength transmission line (because it is at the same voltage or open in the middle). Furthermore, another quarter-wavelength length of the transmission line may be a short circuit, so the common-mode signal is not injected into the mixer.

Note that an integrated circuit implementation of the circuit techniques may be very compact. Moreover, a shielded low-metal transmission line may allow placement of circuits below the filter circuit. Furthermore, the use of a winding transmission line may result in a very small footprint structure. For example, the winding transmission line may have defined in a region having a width of 60 μm.

Figure 14:
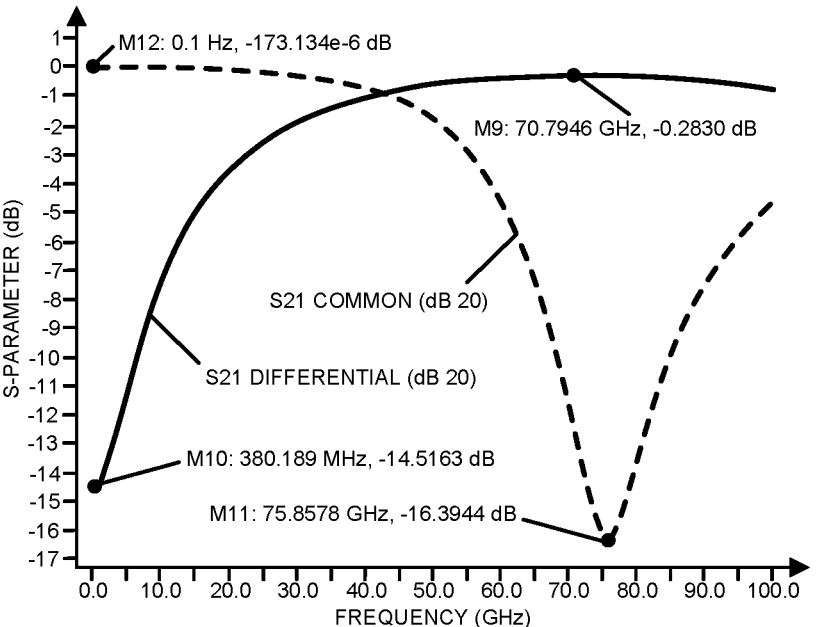
FIG. 14 is a block diagram illustrating an example of an S parameter insertion loss (S21) as a function of frequency for an RF receiver frontend according to some embodiments of the present disclosure.

The common-mode rejection of the half-wavelength transmission line is shown in FIG. 14, which presents a block diagram illustrating an example of an S parameter insertion loss (S21) as a function of frequency for an RF receiver frontend. At RF, the common mode may be suppressed by 16 dB. However, at low frequency, the differential mode may be suppressed by 15 dB. Note that insertion loss of the RF signal may be less than 0.3 dB.

Figure 15:
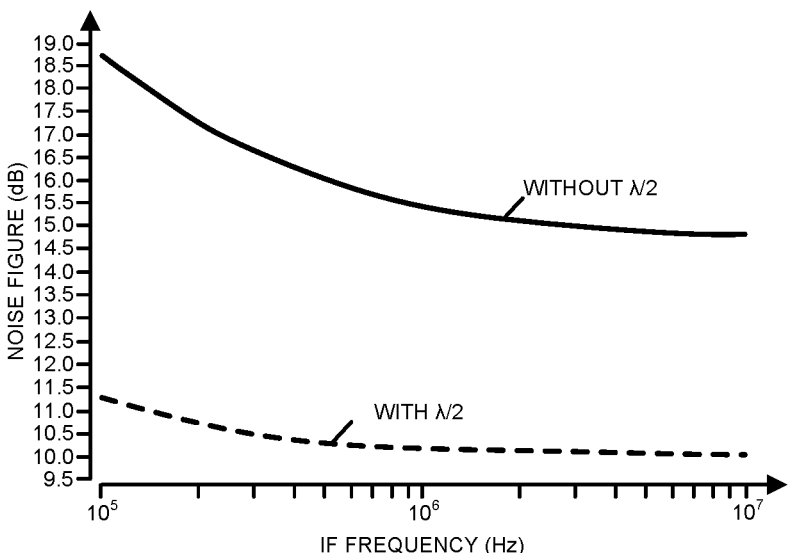
FIG. 15 is a block diagram illustrating an example of a noise figure (NF) as a function of frequency for an RF receiver frontend with and without a half-wavelength transmission line according to some embodiments of the present disclosure.

Moreover, FIG. 15 presents a block diagram illustrating an example of a noise figure as a function of frequency for an RF receiver frontend with and without a half-wavelength transmission line. Note that the noise-figure improvement at low IF may be 6.5 dB, and the noise-figure improvement at high IF may be 5 dB.

Furthermore, the circuit techniques may enable the use of a compact single balanced mixer-first RF frontend receiver. Using a compact single balanced mixer-first configuration may enable MIMO radar. Moreover, with the addition of a separately controlled phase modulation for every RF-receiver input, a single IF chain may be used to support multi-input receivers with reduced cost and higher performance.

Figure 16:
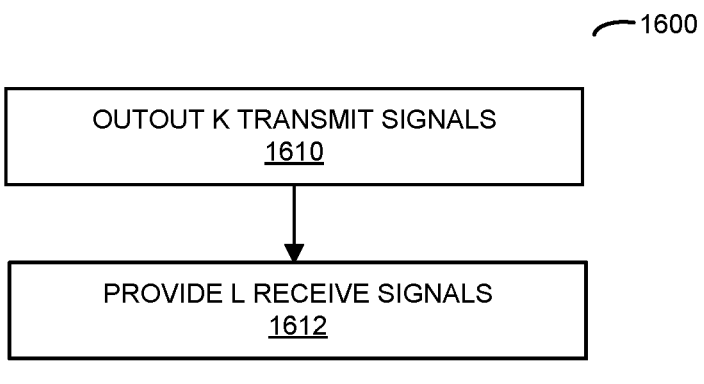
FIG. 16 is a flow diagram illustrating an example of a method for selective filtering according to some embodiments of the present disclosure.

We now describe embodiments of a method. FIG. 16 presents a flow diagram illustrating an example of a method 1600 for selective filtering, which may be performed by an integrated circuit. During operation, the integrated circuit may convert, using a mixer, signals (operation 1610) between a band of frequencies in the RF and a second band of frequencies based at least in part on second signals, where the second band of frequencies is less than the band of frequencies. Moreover, the integrated circuit may filter, using a filter circuit in parallel with input ports to the mixer, the second signals (operation 1612), where the filtering filters out common-mode signals above a threshold frequency and filters out differential signals below the threshold frequency.

For example, the filter circuit may include a transmission line, such as a half-wavelength transmission line. Note that the mixer may convert the differential signals to the common-mode signals below the threshold frequency and may convert the common-mode signals to the differential signals above the threshold frequency. In some embodiments, the threshold frequency may be between 100 MHz and 1 G Hz. Consequently, the filter circuit may be a short circuit for the common-mode signals at 40 MHZ, but may be an open circuit for the differential signals at 80 GHz.

In some embodiments of the method 1600, there may be additional or fewer operations. Moreover, the order of the operations may be changed, and/or two or more operations may be combined into a single operation.

The disclosed integrated circuit and the circuit techniques can be (or can be included in) any electronic device or system. For example, the electronic device may include: a cellular telephone or a smartphone, a tablet computer, a laptop computer, a notebook computer, a personal or desktop computer, a netbook computer, a media player device, an electronic book device, a MiFi® device, a smartwatch, a wearable computing device, a portable computing device, a consumer-electronic device, an access point, a router, a switch, communication equipment, test equipment, a vehicle, a ship, an airplane, a car, a truck, a bus, a motorcycle, manufacturing equipment, farm equipment, construction equipment, or another type of electronic device.

Although specific components are used to describe the embodiments of the integrated circuit and/or the integrated circuit that includes the integrated circuit, in alternative embodiments different components and/or subsystems may be present in the integrated circuit and/or the integrated circuit that includes the integrated circuit. Thus, the embodiments of the integrated circuit and/or the integrated circuit that includes the integrated circuit may include fewer components, additional components, different components, two or more components may be combined into a single component, a single component may be separated into two or more components, one or more positions of one or more components may be changed, and/or there may be different types of components.

Moreover, the circuits and components in the embodiments of the integrated circuit and/or the integrated circuit that includes the integrated circuit may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar. Note that electrical coupling or connections in the preceding embodiments may be direct or indirect. In the preceding embodiments, a single line corresponding to a route may indicate one or more single lines or routes.

As noted previously, at least an integrated circuit may implement some or all of the functionality of the circuit techniques. This integrated circuit may include hardware and/or software mechanisms that are used for implementing functionality associated with the circuit techniques. However, in other embodiments the disclosed circuit techniques may, at least in part, be implemented using discrete components.

In some embodiments, an output of a process for designing the integrated circuit, or a portion of the integrated circuit, which includes one or more of the circuits described herein may be a computer-readable medium such as, for example, a magnetic tape or an optical or magnetic disk. The computer-readable medium may be encoded with data structures or other information describing circuitry that may be physically instantiated as the integrated circuit or the portion of the integrated circuit. Although various formats may be used for such encoding, these data structures are commonly written in: Caltech Intermediate Format (CIF), Calma GDS II Stream Format (GDSII), Electronic Design Interchange Format (EDIF), OpenAccess (OA), or Open Artwork System Interchange Standard (OASIS). Those of skill in the art of integrated circuit design can develop such data structures from schematic diagrams of the type detailed above and the corresponding descriptions and encode the data structures on the computer-readable medium. Those of skill in the art of integrated circuit fabrication can use such encoded data to fabricate integrated circuits that include one or more of the circuits described herein.

While some of the operations in the preceding embodiments were implemented in hardware or software, in general the operations in the preceding embodiments can be implemented in a wide variety of configurations and architectures. Therefore, some or all of the operations in the preceding embodiments may be performed in hardware, in software or both. For example, at least some of the operations in the circuit techniques may be implemented using program instructions that are executed by a processor or in firmware in an integrated circuit.

Moreover, while examples of numerical values are provided in the preceding discussion, in other embodiments different numerical values are used. Consequently, the numerical values provided are not intended to be limiting.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising a radio-frequency (RF) receiver, wherein the RF receiver comprises:

a mixer configured to convert signals between a band of frequencies in radio frequencies and a second band of frequencies based at least in part on second signals, wherein the second band of frequencies is less than the band of frequencies;

wherein the mixer comprises input ports configured to receive the second signals and comprises a filter circuit electrically coupled in parallel with the input ports; and wherein the filter circuit is configured to filter out common-mode signals above a threshold frequency and filters out differential signals below the threshold frequency.

2. The integrated circuit of claim 1, wherein the filter circuit comprises a transmission line.

3. The integrated circuit of claim 2, wherein the transmission line comprises a half-wavelength transmission line.

4. The integrated circuit of claim 2, wherein the transmission line comprises a shielded microstrip transmission line.

5. The integrated circuit of claim 1, wherein the mixer comprises a down-conversion mixer configured to convert the signals from the band of frequencies to the second band of frequencies.

6. The integrated circuit of claim 1, wherein the mixer comprises an up-conversion mixer configured to convert the signals from the second band of frequencies to the band of frequencies.

7. The integrated circuit of claim 1, wherein the RF receiver comprises an amplifier configured to provide the second signals to the mixer.

8. The integrated circuit of claim 1, wherein the signals in the band of frequencies comprise single-ended signals and the signals in the second band of frequencies comprise differential signals.

9. The integrated circuit of claim 1, wherein the mixer is configured to convert the differential signals to the common-mode signals below the threshold frequency and is configured to convert the common-mode signals to the differential signals above the threshold frequency.

10. The integrated circuit of claim 1, wherein the second band of frequencies is greater than DC.

11. The integrated circuit of claim 1, wherein the mixer comprises a balanced mixer.

12. An electronic device, comprising:

an integrated circuit, wherein the integrated circuit comprises a radio-frequency (RF) receiver, wherein the RF receiver comprises:

a mixer configured to convert signals between a band of frequencies in radio frequencies and a second band of frequencies based at least in part on second signals, wherein the second band of frequencies is less than the band of frequencies;

wherein the mixer comprises input ports configured to receive the second signals and comprises a filter circuit electrically coupled in parallel with the input ports; and wherein the filter circuit is configured to filter out common-mode signals above a threshold frequency and filters out differential signals below the threshold frequency.

13. The electronic device of claim 12, wherein the filter circuit comprises a half-wavelength transmission line.

14. The electronic device of claim 12, wherein the mixer comprises a down-conversion mixer configured to convert the signals from the band of frequencies to the second band of frequencies.

15. The electronic device of claim 12, wherein the mixer comprises an up-conversion mixer configured to convert the signals from the second band of frequencies to the band of frequencies.

16. The electronic device of claim 12, wherein the RF receiver comprises an amplifier configured to provide the second signals to the mixer.

17. The electronic device of claim 12, wherein the signals in the band of frequencies comprise single-ended signals and the signals in the second band of frequencies comprise differential signals.

18. The electronic device of claim 12, wherein the mixer is configured to convert the differential signals to the common-mode signals below the threshold frequency and is configured to convert the common-mode signals to the differential signals above the threshold frequency.

19. A method for selective filtering, comprising:

by a radio-frequency (RF) receiver:

converting, using a mixer, signals between a band of frequencies in radio frequencies and a second band of frequencies based at least in part on second signals, wherein the second band of frequencies is less than the band of frequencies;

filtering, using a filter circuit in parallel with input ports to the mixer, the second signals, wherein the filtering filters out common-mode signals above a threshold frequency and filters out differential signals below the threshold frequency.

20. The method of claim 19, wherein the filter circuit comprises a half-wavelength transmission line.

* * * * *